United States Patent [19]

D'Angelo

[11] 4,065,200

[45] Dec. 27, 1977

[54] MOUNTING RACK FOR CIRCUIT PANELS

[76] Inventor: Raymond W. D'Angelo, 18 Coventry Circle, North Haven, Conn. 06473

[21] Appl. No.: 788,803

[22] Filed: Apr. 19, 1977

[51] Int. Cl.² .................... H01R 13/62; H05K 7/18
[52] U.S. Cl. ..................................... 339/65; 361/415
[58] Field of Search ............... 339/65, 66 R, 66 M; 361/399, 415; 211/41

[56] References Cited

U.S. PATENT DOCUMENTS

| 3,231,785 | 1/1966 | Calabro | 361/415 |
| 3,704,394 | 11/1972 | Johnson | 361/415 |

OTHER PUBLICATIONS

IBM Tech. Disc. Bulletin, vol. 17, No. 1, 6-1974, p. 128, Circuit Board Support, Manns.

Primary Examiner—Roy Lake
Assistant Examiner—Neil Abrams
Attorney, Agent, or Firm—Walter Spruegel

[57] ABSTRACT

A cage with opposite endwalls and opposite tracks on the latter for circuit panels, of which each track is formed of a pair of resilient leaves arranged side-by-side and bowed toward each other to leave them with adjacent apices intermediate their lengths, with the leaves of the opposite tracks being symmetrical about a median plane, and the leaves of each pair being spaced closest at their apices so that a panel introduced into a pair of tracks has freedom of tilting motion about the apices as a fulcrum for stress-free register of the panel with a groove in a connector block which is more or less in alignment with the tracks.

1 Claim, 4 Drawing Figures

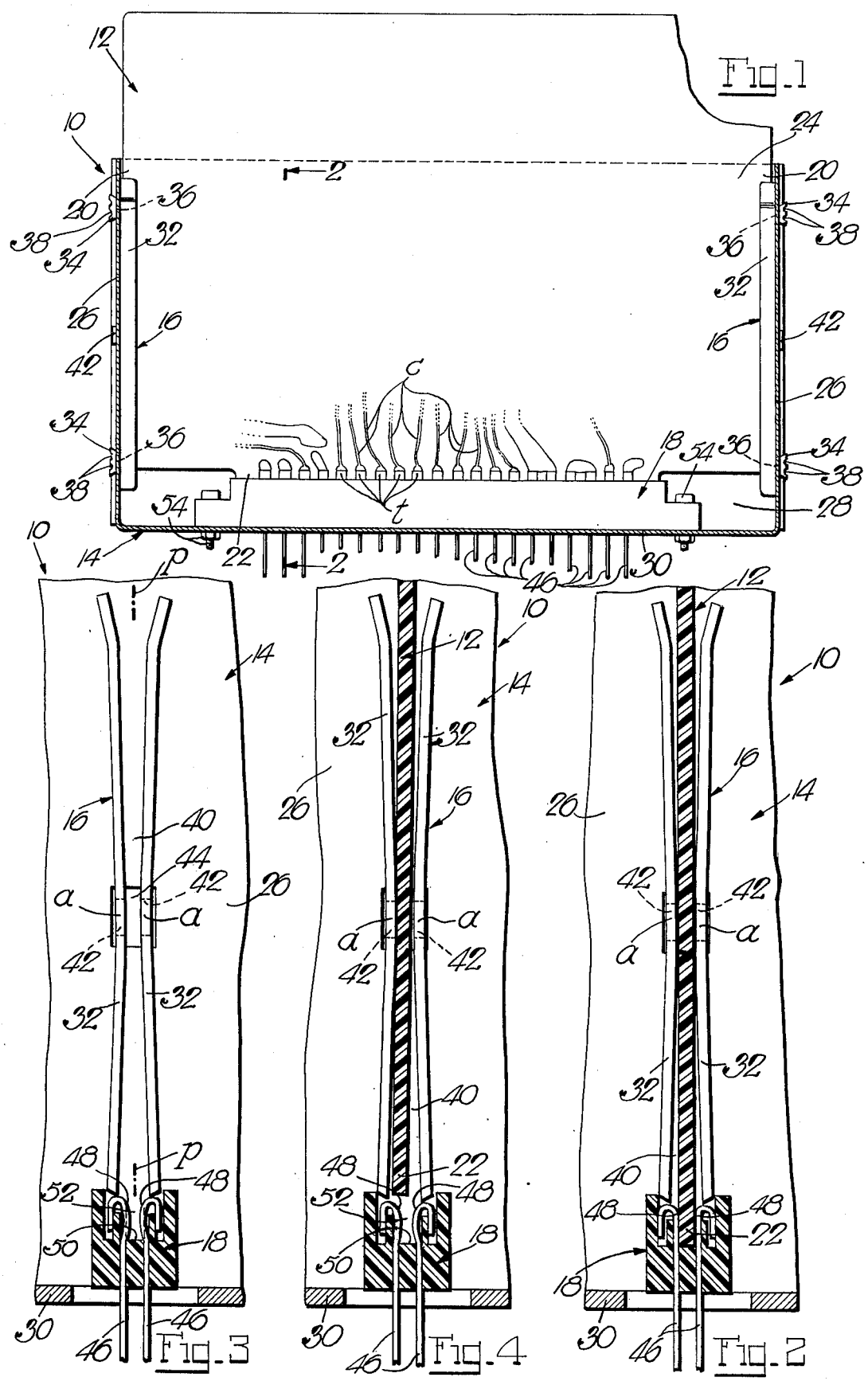

MOUNTING RACK FOR CIRCUIT PANELS

This invention relates to mounting racks for circuit panels, and more particularly to racks for mounting such panels with their circuits connected in the circuitry of associated electronic equipment or the like.

Racks of this type usually provide pairs of opposite tracks and associated connector blocks with grooves aligned with the tracks of the respective pairs, of which the tracks of each pair slidably receive the opposite end edges of a circuit panel for guidance of the latter with a side edge thereof into register with the groove in the associated connector block, and each connector block has terminals connected in the circuitry of associated electronic equipment or the like and extending into the groove in the block to therein contact the circuit or circuits on the registering panel and thereby connect the same in the circuitry of the further equipment through intermediation of the terminals. While these racks are satisfactory in most respects, they are more or less deficient in a few respects. Thus, the tracks on these racks are mostly arranged to provide ways of rectilinear extent and uniform width which despite some resiliency guide and hold a circuit panel primarily in the median plane of these ways which frequently is disaligned, more or less, from the groove in the associated connector block, with the result that the task of registering circuit panels with the grooves in connector blocks is sometimes cumbersome and awkward, and may bring about poor and even incomplete contact between circuit panels and terminals owing to stresses to which panels will be subjected the more their register with the grooves in the associated connector blocks becomes forced. Such stresses in circuit panels springing from their forced register with the grooves in connector blocks may even damage or totally ruin panels, especially those of rather weak construction, such as circuit panels of the cardboard variety, for example. Other tracks on racks of this type are divided into fairly short successive sections, with these tracks being, for the sake of reasonable manufacturing cost, molded in one piece from plastic. However, these molded tracks will break all too easily, especially if they are subjected to stresses ensuing from manipulation of circuit panels into forced register with the grooves in connector blocks.

It is a primary object of the present invention to provide a rack of this type in which the tracks and associated connector blocks are arranged so that circuit panels are left without any stresses in the course of their insertion into the tracks and their alignment and register with the grooves in the respective connector blocks even if any number of the tracks are out of alignment, more or less, with their associated connector blocks. Therefore, such defects as poor or even incomplete electrical connection of circuit panels, or damage to, if not ruin of, such panels, brought on by mounting stresses in the latter, are thus eliminated in this rack arrangement by virtue of the stress-free mount of circuit panels in any event.

It is another object of the present invention to provide a rack of this type in which the tracks are, for the aforementioned stress-free insertion of circuit panels thereinto, arranged to hold the panels securely at every step of their insertion, yet with all the freedom of motion required for aligning and moving them into register with the grooves in the respective connector blocks without subjecting them to any stresses regardless of the extent to which individual tracks may be out of alignment with their associated connector blocks.

It is a further object of the present invention to provide a rack of this type in which the aforementioned freedom of motion afforded to the circuit panels by their holding tracks is a particularly unimpeded tilting motion of these panels with a side edge thereof past and to either side of the grooves in the associated connector blocks, so that registry of any panel in tracks with even a disaligned groove in the associated connector block is particularly free of any stress effect on such a panel. To this end, each of the opposite tracks of a pair is formed by two resilient metal leaves which are arranged side-by-side symmetrically about a median plane and bowed to each other so as to be spaced closest apart at their apices substantially midway of their lengths, with these leaves being with their ends secured to an endwall of a rack so as to be resiliently flexible between their ends, and a connector block being mounted, preferably on the same rack, so as to be with its groove in as close alignment as possible with the median plane between the leaves.

Further objects and advantages will appear to those skilled in the art, considered in conjunction with the accompanying drawings.

In the accompanying drawings, in which certain modes of carrying out the present invention are shown for illustrative purposes:

FIG. 1 is a longitudinal section through a mounting rack for circuit panels which embodies the invention;

FIG. 2 is an enlarged fragmentary section through the mounting rack taken substantially on the line 2—2 of FIG. 1; and FIGS. 3 and 4 are sections similar to that of FIG. 2, but showing tracks with no inserted circuit panel and with a partly inserted circuit panel, respectively.

Referring to the drawings, the reference numeral 10 designates a mounting rack for circuit board panels 12, which has for its major components a cage 14, a plurality of pairs of opposite tracks 16 for panels 12, and blocks 18 for electrical connection of the circuits on the panels in the circuitry of electronic equipment or the like (not shown).

The panels 12 may be of any conventional kind, being of any suitable insulating material, such as plastic or cardboard, for example, with attached circuitry, usually printed circuitry $c$ with connector tabs $t$. The circuit panels 12 are generally rectangular, having opposite end edges 20 and a bottom strip 22 on which the connector tabs $t$ are arranged in an orderly row.

The cage 14 is in this instance open at the top 24 and has opposite endwalls 26, opposite sidewalls 28, and a bottom wall 30. Each of the opposite tracks 16 of a pair provides two slightly resilient leaves 32 which are mounted on an endwall 26 of the cage 14 and disposed thereon side-by-side, with the leaves 32 of the opposite tracks of each pair having a common median plane $p$ about which they are symmetrical. For mounting the leaves on the respective endwalls 26 of the cage 14, each leaf 32 is at or near its opposite ends provided with rear fingers 34 which extend through slots 36 in the respective endwall 26 and are locked to the latter by being crimped as at 38.

In accordance with a featured aspect of the invention, the leaves 32 of each track are bowed toward each other to leave them with adjacent apices $a$, intermediate, and in this instance substantially midway of, their lengths, with the leaves 32 being thus bowed by being in this instance of shallow V-shape.

The leaves 32 of each pair are spaced to form a guide channel 40, with their spacing being closest at the adjacent apices $a$, to there receive an end edge 20 of a panel 12 with a slide-like fit. With the leaves 32 of each pair being somewhat resilient, provisions are made to prevent them from becoming excessively flexed outwardly at their apices $a$ from any cause whatever. To this end, the leaves 32 are at their apices $a$ provided with rear fingers 42 which extend into apertures 44 in the respective endwalls 26 of the cage 14 that limit outward flexing of the leaves.

Each connector block 18 is a molded insulating part provided with a multiplicity of molded-in terminals 46 with contacts 48. These contacts 48 line the opposite sidewalls of a groove 50 in the block in slightly yielding fashion, and define themselves a groove formation 52 into which the bottom strip 22 of a panel 16 is to be slid for engagement of the connector tabs $t$ on the panel with the contacts 48 on the terminals to thereby connect this panel in the circuitry of associated electronic equipment or the like. Each block 18 is secured to the bottom wall 30 of the cage 14 as at 54, with the block being positioned so that the groove formation 52 between the terminal contacts 48 is in substantial alignment with the median plane $p$ of the associated tracks 16.

FIGS. 1 to 4 show only one pair of opposite tracks 16 with an associated connector block 18, but it is to be understood that additional pairs of opposite tracks with associated connector blocks may be, and usually are, provided in the cage 14, with all track pairs and their associated connector blocks extending with their median planes in substantial parallelism.

For use of the rack, as many circuit panels 12 as are required for a particular application are slid with their end edges 20 into a corresponding number of opposite tracks 16. In thus introducing a panel into a pair of tracks 16, the panel has freedom of tilting motion about the adjacent apices $a$ of the leaves 32 of each track (FIG. 4), with such freedom of tilting motion of the panel being with its bottom strip 22 to either side of the groove formation 52 between the terminal contacts 48 in the associated connector block 18 regardless of whether the latter is in alignment, or is to some extent out of alignment, with the median plane of the associated tracks 16, so that the panel is not in any way stressed on its insertion in the tracks 16 and on its alignment and register with the groove formation 52 in the connector block 18. Reliable and lasting circuit-making engagement between the connector tabs $t$ on the panel and the terminal contacts 48 in the connector block 18 is thus assured.

What is claimed is:

1. A mounting rack for circuit panels with oppposite end edges and a side edge, comprising a cage with opposite walls each of which has an aperture; at least one pair of identical opposite guide channels with a common median plane for sliding reception of a circuit panel with its end edges, of which each guide channel is formed by a pair of resilient metal leaves disposed side-by-side and bowed toward each other to leave them with apices intermediate their lengths, with the leaves of each pair being arranged symmetrically about said median plane and being with their ends secured to a cage wall, and the leaves of each pair having at their apices lateral fingers extending into the aperture in the cage wall to which said leaves are secured for limiting separating movement of said leaves; and a connector block mounted in said cage and having a groove in substantial alignment with said median plane, with a circuit panel in said guide channel being tiltable about the apices of said leaf pairs as a fulcrum and being locked in position therein on sliding the circuit panel with its side edge into register with said groove.

* * * * *